United States Patent [19]
Suzuki et al.

[11] 3,913,127
[45] Oct. 14, 1975

[54] GLASS ENCAPSULATED SEMICONDUCTOR DEVICE CONTAINING CYLINDRICAL STACK OF SEMICONDUCTOR PELLETS

[75] Inventors: Kensuke Suzuki; Takeshi Ishizuka; Takeshi Sasaki, all of Hitachi, Japan

[73] Assignee: Hitachi, Ltd., Japan

[22] Filed: Apr. 15, 1974

[21] Appl. No.: 461,117

Related U.S. Application Data

[63] Continuation of Ser. No. 293,098, Sept. 28, 1972, abandoned.

[30] Foreign Application Priority Data

Oct. 1, 1971 Japan ............................... 46-76360

[52] U.S. Cl. ...................... 357/73; 357/74; 357/75; 357/76

[51] Int. Cl.$^2$ ........................................ H01L 23/30

[58] Field of Search .................... 357/73, 74, 75, 76

[56] References Cited

UNITED STATES PATENTS

| | | | |
|---|---|---|---|
| 3,241,010 | 3/1966 | Eddleston | 357/73 |
| 3,363,150 | 1/1968 | Whitman | 357/76 |
| 3,505,571 | 4/1970 | Devolder | 357/73 |
| 3,698,080 | 10/1972 | Berner | 357/73 |
| 3,721,868 | 3/1973 | Smith | 357/73 |
| 3,736,475 | 5/1973 | Berner | 357/76 |
| 3,811,084 | 5/1974 | Shima et al. | 357/76 |

*Primary Examiner*—Andrew J. James
*Attorney, Agent, or Firm*—Craig & Antonelli

[57] ABSTRACT

A high-voltage semiconductor device characterized in that a rectifier unit comprises a lamination of electrically series-connected and mechanically bonded semiconductor pellets and a pair of electrodes with external lead wires which are electrically connected and mechanically bonded with said lamination by means of soldering materials, the peripheral surface of the rectifier unit is covered with a protective glass layer over the entire length from one of the electrodes to the other, the amount of thermal expansion of the rectifier unit being made equal to or less than that of the protective glass layer either by regulating the thickness of the solding materials or semiconductor pellets or by inserting at least one spacer in the rectifier unit, so that compressive stress is exerted upon the rectifier unit.

17 Claims, 4 Drawing Figures

GLASS ENCAPSULATED SEMICONDUCTOR DEVICE CONTAINING CYLINDRICAL STACK OF SEMICONDUCTOR PELLETS

This is a continuation of application Ser. No. 293,098 filed Sept. 28, 1972, now abandoned.

This invention relates to a high-voltage semiconductor device or more in particular to a high-voltage small-current-capacity semiconductor device used for a high-voltage power circuit of an electron microscope, an X-ray apparatus, or a TV receiver.

The conventional high-voltage small-currentcapacity semiconductor device comprises a pair of tungsten or molybdenum electrodes each with an external lead wire attached to an end thereof, a rectifier unit including a plurality of series-connected semiconductor pellets which are interposed between and lamination-bonded with said pair of electrodes, a first insulating material such as silicone rubber covered over the peripheral portion of the rectifier unit over the entire length from one electrode to the other and a second insulating material such as silicone resin or epoxy resin which is covered over the first insulating material.

In the high-voltage semiconductor device of the above-described construction, the bond between the electrodes and the first insulating material is unstable and there is a great difference in the coefficient of thermal expansion between the first and second insulating materials, so that when the second insulating material is cured after covered on the first insulating material there often develops a space between them, especially, over the length between one electrode and the other, resulting in a dielectric breakdown due to creep discharge for costly loss of the functions as a high-voltage semiconductor device.

In order to achieve a high breakdown voltage, it is common to connect a plurality of the above-mentioned high-voltage semiconductor devices in series and mold them integrally with epoxy resin. This is not only effective in preventing the discharge which otherwise might occur between the charging sections or exposed portions of the conductor but is convenient for handling the semiconductor devices. But this construction has the disadvantage that the increased sectional area of the epoxy resin causes strain which was not seen in an independent high-voltage semiconductor device.

Epoxy resin generally has a coefficient of thermal expansion higher than a semiconductor pellet by one order, and the semiconductor pellet develops a tensile stress at high temperatures due to the difference in the coefficient of thermal expansion, to which the semiconductor pellet easily succumbs. In order to prevent this, it is common practice to control the allowable ambient temperature of the integrated mold devices at 100°C or less.

This problem of tensile stress is solved by the use of the first insulating material of glass almost equal to silicon and the electrodes in the coefficient of thermal expansion. Also, since glass is not only stable electrically but also strong mechanically, the second insulating material is saved, thereby contributing to the compactness and lower cost of the high-voltage semiconductor device.

This type of high-voltage semiconductor device comprises a pair of electrodes, a plurality of series-connected semiconductor pellets which are bonded in laminae to make upp a rectifier unit and glass slurry or a mixture of glass powder and water which is covered over the entire length between the electrodes on the outer peripheral surface of the rectifier unit. This glass slurry is melted by heat and solidified by cooling.

The most widely used material of a semiconductor pellet is silicon. Also, aluminum solder is generally employed as a soldering material because of its low cost, good ohmic contact and absence of distortion when heating the glass. Silicon, glass and aluminum have coefficients of thermal expansion of $3.52 \times 10^{-6}$, $4.0 \times 10^{-6}$ and $25.7 \times 10^{-6}$ respectively. This shows that the coefficient of thermal expansion of glass is almost the same as that of silicon but the coefficient of thermal expansion of aluminum solder, as already explained above, is higher than that of silicon by about one order, causing compressive stress in glass and tensile stress in the silicon semiconductor pellet and aluminum solder during the process of the cooling of the glass. Because of the difference in the breakdown levels of these materials which are 1 kg/mm$^2$, 4 kg/mm$^2$ and 15 to 20 kg/mm$^2$ for silicon, glass and aluminum respectively, it may happen that the silicon semiconductor pellet or even glass breaks during the cooling of the glass, thereby preventing the wide spread use of a high-voltage semiconductor device comprising a semiconductor pellet covered with glass.

An object of the present invention is to provide a high-voltage semiconductor device comprising a pair of electrodes sandwiching a plurality of semiconductor pellets bonded in laminae constituting a rectifier unit around which is covered glass over the entire length from one electrode to the other in such a manner as to eliminate the deterioration or breakdown due to thermal expansion.

Another object of the present invention is to provide a mechanically strong, compact and economical high-voltage semiconductor device which has a rectifier unit covered with glass.

Still another object of the present invention is to provide a high-voltage semiconductor device so constructed that the rectifier unit is not adversely affected electrically when it is covered with glass.

The high-voltage semiconductor device according to the present invention is characterized by the fact that a rectifier unit comprising a pair of electrodes each with an external lead wire attached to an end thereof and a plurality of semiconductor pellets which are connected in series electrically and physically bonded in laminae by means of a soldering material, the peripheral portion of the rectifier unit being covered with glass over the entire length extending between the electrodes, so that the thermal expansion of the rectifier unit is made equal to or smaller than that of the covered glass by adjusting the thickness of the soldering material or semiconductor pellets or by the interposition of at least one spacer within the rectifier unit.

The present invention will now be described with reference to the accomppanying drawings, in which.

Figure 1:
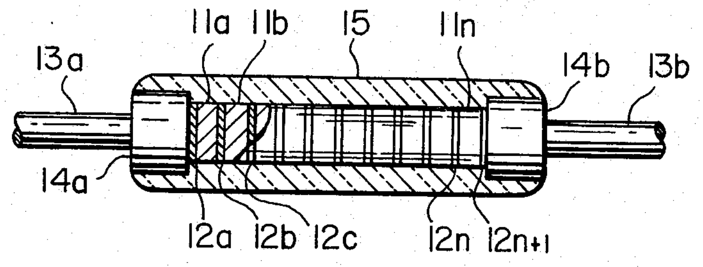
FIG. 1 is a diagram showing a longitudinal section of a part of an embodiment of the present invention.
Figure 2:
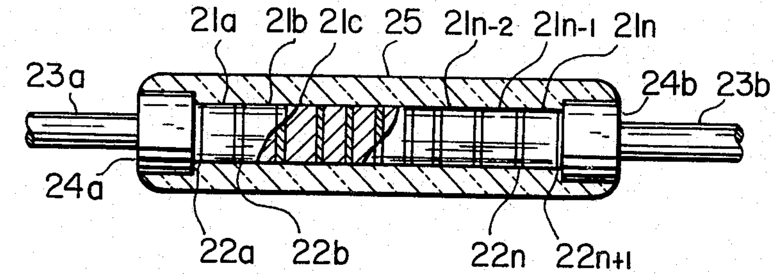
FIG. 2 is a diagram showing a longitudinal section of a part of a modification of the high-voltage semiconductor device according to the present invention in which some of the lamination-bonded semiconductor pellets are thicker than the rest thereof.
Figure 3:
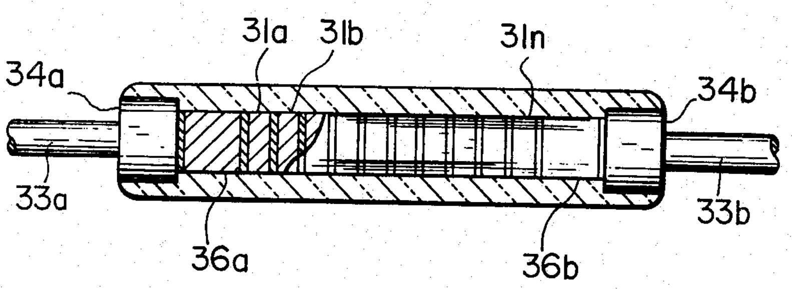
Figure 4:
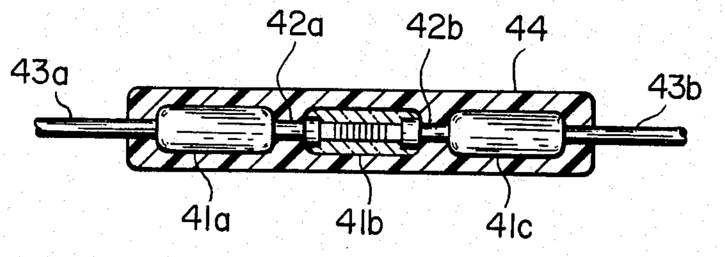

FIG. 3 is a diagram showing a longitudinal section of a part of another modification of the present invention in which a plurality of spacers without any PN junction and with samll electric resistance are interposed between a plurality of lamination-bonded semiconductor pellets; and FIG. 4 is a diagram showing a longitudinal section of a part of an integrated high-voltage semiconductor device comprising a plurality of the semiconductor units shown in FIG. 1, 2 or 3.

Referring to FIG. 1, the reference numerals 11*a*, 11*b* . . . 11*n* show silicon semiconductor pellets with a PN or PIN junction, which are bonded in laminae with each other by means of aluminum soldering materials 12*b*, 12*c*, . . . 12*n* so that the semiconductor pellets are connected in series electrically. The silicon semiconductor pellets 11*a* and 11*n* which are positioned at the ends of the lamination have external lead wires 13*a* and 13*b* attached thereto. The electrodes 14*a* and 14*b* of tungsten or molybdenum which are almost equal in coefficient of thermal expansion to silicon making up the semiconductor pellets 11*a*, 11*b*, . . . 11*n* are also bonded in laminae to the semiconductor pellets by means of the aluminum soldering materials 12*a* and $\mathbf{12}_{n+1}$ respectively.

The assembly under this condition is called a rectifier unit. In actual practice, this rectifier unit is manufactured by depositing a predetermined thickness of aluminum solder on both sides of a semiconductor wafer with a certain surface area, so that a plurality of such wafers are laid one on another and bonded together by heat. After cooling the aluminum solder and semiconductor wafers, the lamination-bonded semiconductor wafers are cut into a cylindrical stack with a diamond blade or other cutter in order to produce semiconductor pellets with a predetermined surface area. As the next step, the electrodes are bonded by heat to the stack to obtain the rectifier unit.

According to the present invention, aluminum is used as a soldering material to bond the semiconductor pellets 11*a*, 11*b*, . . . 11*n* with each other and to bond the electrodes 14*a* and 14*b* thereto because aluminum has not only good wettability to silicon but also a suitable melting point such that it does not melt enough to cause separation therebetween during the heating process and low electric resistance. Other soldering materials such as a silmin solder foil of an aluminum-silicon alloy may be used as far as it meets the above-mentioned requirements.

The rectifier unit is covered with a lowalkali glass layer over the entire length between the electrodes 14*a* and 14*b* in order to stabilize the exposed peripheral portions of each PN or PIN junction and provide mechanical strength to the rectifier unit.

The covering glass 15 consists of a mixture of glass powder and water which is stirred into a slurry form and covered over the peripheral areas of the rectifier unit. The method of processing the glass varies with its composition, but in the embodiments of the present invention, it is heated at 700° to 730°C for about 3 minutes and then cooled into a hardened state. Therefore, the soldering materials 12*a*, 12*b*, . . . $\mathbf{12}_{n+1}$ are required to have such a melting point that the semiconductor pellets do not come off at the temperatures of 700° to 730°C at which glass is processed.

the high-voltage semiconductor device according to the present invention which has the above-mentioned construction and is obtained through the above-mentioned manufacturing processes has a rectifier unit with a coefficient of axial thermal expansion equal to or lower than that of glass. In other words, the amount of thermal expansion of the rectifier unit is made equal to or less than that of glass. This relationship will be given by the inequality $$(T_H - T_A)(\alpha_1 t_1 + \alpha_2 t_2) \leq (T_H - T_A)\alpha_3(t_1 + t_2)$$

where $T_H$ is the apparent solidifying temperature of glass 15, $T_A$ room temperature, $\alpha_1$ the coefficient of linear expansion of the semiconductor pellets, $\alpha_2$ the coefficient of linear expansion of the soldering materials, $\alpha_3$ the coefficient of linear expansion of glass 15, $t_1$ the total thickness of the semiconductor pellets, and $t_2$ the total thickness of the soldering materials. If these symbols, $T_H$, $T_A$, $\alpha_1$, $\alpha_2$ and $\alpha_3$ are constants while $t_1$ and $t_2$ are variable.

In the embodiment shown in FIG. 1, the total thickness $t_2$ of the soldering materials is adjusted so as to satisfy the above inequality. This adjustment is made by regulating the thickness of aluminum solder deposited on a silicon semiconductor wafer.

As a result, the glass 15 is subjected to a tensile stress and the rectifier unit to a compressive stress during the process of hardening the glass 15. Silicon which is a main component of the semiconductor pellet easily succumbs to a tensile strength as mentioned earlier but stands considerable compressive force. According to the present invention, the semiconductor pellets 11*a*, 11*b*, . . . 11*n* are subjected to a compressive force due to thermal expansion but are rarely broken down during the cooling process for a greatly improved yield.

Generally, glass has a high mechanical strength and the covered glass 15 protects not only the semiconductor pellets 11*a*, 11*b*, . . . 11*n* but the exposed PN or PIN junctions from external forces. Also, it is possible to make thinner its thickness in the radial direction with the result that the whole structure of the high-voltage semiconductor device can be made much smaller than the conventional semiconductor device covered with double layers of epoxy resin.

As already mentioned, the coefficient of linear expansion of aluminum solder is greater than that of glass by about one order and therefore, if the number of the semiconductor pellets making up the lamination is great, the intended object is achieved by regulating the thickness $t_2$ of the solder. When the number $n$ of the semiconductor pellets is small, however, it is impossible to lessen the thickness $t_2$ of the solder greatly in view of the effect of lamination bondage. In such a case, as shown in FIG. 2, the thickness of all or some of the semiconductor pellets may be increased to lengthen the whole assembly in the axial direction, so that the amount of thermal expansion of the rectifier unit may be made equal to or smaller than that of the covered glass in order to apply a compressive stress to the rectifier unit.

In FIG. 2, among the semiconductor pellets 21*a*, 21*b* . . . 21*n* which are lamination-bonded with each other, those semiconductor pellets 21*a*, 21*b* 21*c*, , 21*n*—2, , 21*n*—1 and 21*n* which are adjacent to the electrodes 24*a* and 24*b* are thicker than the pellets 21*d*, . . . 21*n*—3. . When the semiconductor pellets 21*a*, *21b* . . . *21n* have a PIN junction, the semiconductor pellets adjacent to the electrodes 24*a* and 24*b* can be made thicker than the remaining pellets by increasing the thickness of the I layer thereof.

The semiconductor pellets 21$a$, $21b$ . . . $21n$, like those pellets shown in FIG. 1, are produced by first depositing by evaporation aluninum solder on both sides of a plurality of semiconductor wafers of two different thicknesses, laying them one on another into a lamination, heating, cooling and cutting the assembly into a column, and fixing to both ends thereof the electrodes 24$a$ and 24$b$ with the external lead wires 23$a$ and 23$b$, thus completing a rectifier unit. The semiconductor pellets 21$a$, 21$b$, . . . 21$n$ are bonded with each other and with electrodes 24$a$ and 24$b$ by means of the aluminum solders 22$a$, 22$b$, . . . 22$n$+1. Glass slurry is coated over the entire length from one electrode 24$a$ to the other electrode 24$b$ of the rectifier unit, heated, sintered and cooled into a cover glass 25 to complete a highvoltage semiconductor device.

In this embodiment, the semiconductor pellets 21$a$, 21$b$, 21$c$, 21$n$—2, 21$n$—1and 21$n$ act to regulate the amount of thermal expansion of the high-voltage semiconductor device, and also an increased thickness of the I layer contributes to a higher breakdown voltage.

Instead of increasing the thickness of the semiconductor pellets, spacers with a low electric resistance and without any PN junction may be inserted in the rectifier unit to achieve the same purpose. Such spacers should preferably be inserted between the electrodes and the semiconductor pellets separately in order to obtain an improved breakdown voltage of the semiconductor pellets which otherwise might be situated adjacent to the electrodes.

This principle is embodied in the semiconductor device shown in FIG. 3, in which the spacers 36$a$ and 36$b$ are seen to be inserted and bonded between the electrode 34$a$ and the semiconductor group and between the electrode 34$b$ and the same semiconductor group respectively by means of aluminum solder. It is desirable to employ spacers with a low electric resistance, as well as almost the same coefficient of thermal expansion and fragility as the semiconductor pellets and which are easy to process. The present embodiment employs a P- or N-type silicon material with an impurities concentration of about $1 \times 10^{18}$ to $1 \times 10^{19}$ atoms/cm$^3$ or more.

When the sectional area of the spacers is larger than that of the semiconductor pellets, the stress due to thermal expansion is exerted on the spacers 36$a$ and 36$b$ but not on the electrodes, thereby rendering the provision of the spacers meaningless. To prevent this situation, the sectional area of the spacers 36$a$ and 36$b$ should be equal to that of the semiconductor pellets, and by doing so, the manufacturing processes of the spacers and semiconductor pellets are facilitated.

The spacers consisting of a one-conduction type semiconductor with a high impurities concentration are heat-bonded with silicon semiconductor wafers in advance by means of an aluminum solder and then the assembly is cut into cylindrical form, followed by the bondage by heat of the electrodes 34$a$ and 34$b$ with the external lead wires 33$a$ and 33$b$ to form a rectifier unit.

During the process of covering the glass 35 on the rectifier unit, it sometimes happens that air mixes with the glass slurry, resulting in air bubbles being present between the spacer 36$a$ and electrodes 34$a$ or between the spacer 36$b$ and electrode 34$b$. The presence of spacers 36$a$ and 36$b$, however, prevents such air bubbles from reaching the exposed portions of the PN or PIN junction of semiconductor pellets 31$a$ and 31$n$ which otherwise might be adjacent to the electrodes 34$a$ and 34$b$. As a result, the breakdown voltage of the semiconductor pellets 31$a$ and 31$n$ is not lowered even in the presence of the air bubbles, making it possible to obtain a high-voltage semiconductor device with a desired breakdown voltage.

The semiconductor spacers might be inserted at any positions between the semiconductor pellets or between one electrode and the semiconductor pellets, if the only purpose is to adjust thermla expansion. But the improvement in breakdown voltage requires the construction mentioned in the preceding paragraphs.

In this embodiment employing semiconductor spacers, the relationship between the thermal expansion of the rectifier unit and that of covered glass 35 is given in the inequality $$(T_H - T_A)(\alpha_1 t_1 + \alpha_2 t_2 + \alpha_4 t_4) \leqq (T_H - T_A)\alpha_3(t_1 + t_2 + t_4),$$

where $T_H$, $T_A$, $\alpha_1$, $\alpha_2$, $\alpha_3$, $t_1$ and $t_2$ show the same factors as in the foregoing inequality, $\alpha_4$ the coefficient of thermal expansion of the spacers and $t_4$ the total thickness of the spacers.

As still another embodiment, it may be so arranged that the spacers act as at least one of the electrodes at the same time. In this case, for the reason already mentioned, it is required that the electrode doubling as the spacer has the same sectional area as the semiconductor pellets.

In the embodiments of FIGS. 1 to 3, the thickness of the semiconductor pellets, aluminum solder and spacers is exaggerated relative to their sectional areas for convenientce of illustration. The thickness of these elements will be now explained with reference to an example of the high-voltage semiconductor device according to the present invention with the following specification:

| | |
|---|---|
| Thickness of a single semiconductor pellet | 230$\mu$ |
| Number of layers of semiconductor pellets included in the lamination | 13 |
| Thickness of each aluminum soldering layer | 10$\mu$ |
| Number of aluminum soldering layers | 14 |
| Apparent solidifying temperature of glass ($T_H$) | 475°C |
| Room temperature ($T_A$) | 30°C |
| Coefficient of thermal expansion of semiconductor pellet ($\alpha_1$) | $3.52 \times 10^{-6}$/°C |
| Coefficient of thermal expansion of aluminum solder ($\alpha_2$) | $25.7 \times 10^{-6}$/°C |
| Coefficient of thermal expansion of glass ($\alpha_3$) | $4.0 \times 10^{-6}$/°C |
| Coefficient of thermal expansion of semiconductor spacer ($\alpha_4$) | $3.52 \times 10^{-6}$/°C |

1. In the embodiment of FIG. 1, the thickness of one aluminum solder layer is 4.7 $\mu$.
2. In the embodiment of FIG. 2, the thickness of one semiconductor pellet is 488$\mu$ and the number of pellets having increased thickness is 13.
3. In the embodiment of FIG. 3, the thickness of the semiconductor spacers is 3.8 mm.
4. In the case where one of the electrodes doubles as the semiconductor spacer, the thickness of such a spacer is 3.34 mm.

Under these conditions, it was recognized that compressive stress acts upon the rectifier unit and tensile stress upon the covered glass.

FIG. 4 shows an integrated high-voltage semiconductor device comprising a plurality of electrically series-connected high-voltage semiconductor devices embodying the present invention.

In this figure, thee high-voltage semiconductor devices 41$a$, 41$b$ and 41$c$ comprise rectifier units covered with glass and each makes up the same unit as those shown in FIGS. 1 to 3. The lead wires 42$a$ and 42$b$ are attached to them so as to connect them in series electrically, while external lead wires 43$a$ and 43$b$ are connected to the high-voltage semiconductor devices 41$a$ and 41$c$, after which epoxy resin or glass 44 is covered on the assembly for integration molding. Each high-voltage semiconductor device is subjected to stress due to thermal expansion during the molding operation, but it is prevented from breakdown by the glass covering.

What is claimed is:

1. A high-voltage semiconductor device comprising:

a. a rectifier unit, which includes first and second electrodes, a plurality of semiconductor pellets each having a rectifying PN junction exposed at the periphery of each of said pellets and interposed between said electrodes, and a plurality of soldering material layers made of aluminum and disposed between adjacent ones of said pellets, mechanically and electrically bonding and connecting said pellets with each other, said pellets and said soldering material layers being laminated together in the form of a stack with said first and second electrodes being disposed in contact with the soldering material layers at opposite ends of said stack; and b. a protective glass layer for passivating the PN junctions of said pellets and for protecting said rectifier unit against mechanical ambient stress and having a prescribed coefficient of thermal expansion not smaller than the effective coefficient of thermal expansion of said rectifier unit, surrounding and contiguous to the exposed surfaces of said pellets, said glass layer extending from the periphery of said first electrode to the periphery of said second electrode and being contiguous to the peripheries of said electrodes so that a compressive stress is imparted to the rectifier unit in the axial direction thereof.

2. A high voltage semiconductor device according to claim 1, further including first and second lead wires respectively extending from and being mechanically ane electrically bonded to said first and second electrodesin said axial direction.

3. A high voltage semiconductor device according to claim 1, wherein said protective glass layer has such a thickness that the rectifier unit is protected from ambient mechanical stress.

4. A high voltage semiconductor device according to claim 1, wherein the area of each of said electrodes is larger than the area of the pellets bonded thereto.

5. A high-voltage semiconductor device comprising:

a. a rectifier unit, which includes first and second electrodes, a plurality of semiconductor pellets each having a rectifying PN junction exposed at the periphery of each of said pellets and interposed between said electrodes, a plurality of soldering material layers made of aluminum and disposed between adjacent ones of said pellets mechanically and electrically bonding and connecting said pellets with each other, said pellets and said soldering material layers being laminated together in the form of a stack, a spacer made of a material having low electrical resistance and a coefficient of thermal expansion approximate to that of said pellets disposed between and contiguous to said first electrode and a soldering material layer at one end of said stack adjacent said first electrode, and said second electrode being electrically connected to the other end of said stack, and b. a protective glass layer for passivating said PN junctions exposed at the periphery of each of said pellets and for protecting said rectifier unit against mechanical ambient stress having a prescribed coefficient of thermal expansion not smaller than the effective coefficient of thermal expansion of said rectifier unit, surrounding and contiguous to the exposed surfaces of said pellets, said glass layer extending from the periphery of said first electrode to the periphery of said second electrode and being contiguous to the peripheries of said electrodes so that a compressive stress is imparted to the rectifier unit in the axial direction thereof.

6. A high-voltage semiconductor device according to claim 5, further including an additional spacer made of said material having low electrical resistance and coefficient of thermal expansion approximate to that of said pellets disposed between and contiguous to said second electrode and a soldering material layer at the other end of said stack, with the combined thicknesses of said spacers being such that said effective coefficient of thermal expansion is not larger than that of said glass layer so that a compressive stress is imparted to the rectifier unit in the axial direction thereof.

7. A high-voltage semiconductor device according to claim 5, the sectional area of said spacer is substantially equal to that of said semiconductor pellets so that the compressive stress due to thermal expansion of the protective glass layer is exerted between said electrodes.

8. A high-voltage semiconductor device according to claim 6, the sectional area of said additional spacer is substantially equal to that of said semiconductor pellets so that the compressive stress due to thermal expansion of the protective glass layer is exerted between said electrodes.

9. A high-voltage semiconductor device according to claim 5, further including first and second lead wires respectively extending from and being mechanically and electrically bonded to said first and second electrodes in said axial direction.

10. A high-voltage semiconductor device according to claim 5, wherein said protective glass layer has such a thickness that the rectifier unit is protected from ambient mechanical stress.

11. A high-voltage semiconductor device according to claim 5, wherein the area of each of said electrodes is larger than the area of the pellets bonded thereto.

12. A high voltage semiconductor device comprising:

a rectifier unit which includes first and second electrodes, a plurality of semiconductor pellets, each having a rectifying PN junction extending to the periphery thereof, and having a prescribed total thickness $t_1$ and a prescribed coefficient of thermal expansion $\alpha_1$, interposed between said first and second electrodes, and a plurality of soldering material layers, having a prescribed total thickness $t_2$ and each being made of a material having a coefficient of thermal expansion $\alpha_2$ greater than the coefficient of thermal expansion of said pellets $\alpha_1$, disposed between adjacent ones of said pellets, mechanically and electrically bonding and connecting said pellets with each other;

said pellets and said soldering material layers being laminated together in the form of a stack, with said first and second electrodes being disposed in contact with the soldering material layers at opposite ends of said stack; and a protective glass layer for passivating the PN junctions of said pellets and for protecting said rectifier unit agaiainst ambient mechanical stress, said glass layer having a prescribed coefficient of thermal expansion $\alpha_3$, surrounding and contiguous to the exposed surfaces of said pellets, said glass layer extending from the periphery of said first electrode to the periphery of said second electrode and being contiguous to the peripheries of said first and second electrodes, and wherein the total effective amount of thermal expansion of said rectifier unit is no greater than that of said glass, with the coefficients of thermal expansion $\alpha_1$, $\alpha_2$ and $\alpha_3$ and the total thickness $t_1$ of the pellets and $t_2$ of the soldering material layers satisfying the equation:

$$(T_H - T_A)\,(\alpha_1 t_1 + \alpha_2 t_2) \leq (T_H - T_A)\,\alpha_3\,(t_1 + t_2)$$

where $T_H$ is the apparent solidifying temperature of glass and $T_A$ is room temperature, so that a compressive stress is imparted to the rectifier unit in the axial direction thereof.

13. A high-voltage semiconductor device according to claim 12, wherein said material of which said soldering material layers are made consists of aluminum, and further including first and second lead wires respectively extending from and being mechanically and electrically bonded to said first and second electrodes in said axial direction, and the area of each of said first and second electrodes is larger than the area of the pellets bonded thereto.

14. A high-voltage semiconductor device comprising:

a rectifier unit which includes first and second electrodes, a plurality of semiconductor pellets, each having a rectifying PN junction extending to the periphery thereof, and having a prescribed total thickness $t_1$ and a coefficient of thermal expansion $\alpha_1$, interposed between said first and second electrodes, a plurality of soldering material layers, having a prescribed total thickness $t_2$ and each being made of a material having a coefficient of thermal expansion $\alpha_2$ greater than the coefficient of thermal expansion $\alpha_1$ of said pellets, disposed between adjacent ones of said pellets, mechanically and electrically bonding and connecting said pellets with each other, said pellets and said soldering material layers being laminated together in the form of a stack, and a spacer, made of a material having low electrical resistance, a thickness $t_3$, and a coefficient of thermal expansion $\alpha_3$ which is approximate to that of said pellets, disposed between and contiguous to said first electrode and that soldering material layer which is at the one end of said stack adjacent said first electrode, said second electrode being electrically connected to the other end of said stack; and a protective glass layer for passivating the PN junctions of said pellets and for protecting said rectifier unit against ambient mechanical stress, said glass layer having a prescribed coefficient of thermal expansion $\alpha_4$, surrounding and contiguous to the exposed surfaces of said pellets, said glass layer extending from the periphery of said first electrode to the periphery of said second electrode and being contiguous to the peripheries of said first and second electrodes, and wherein the total effective amount of thermal expansion of said rectifier unit is no greater than that of said glass, with the coefficients of thermal expansion $\alpha_1$, $\alpha_2$, $\alpha_3$ and $\alpha_4$, and the thickness $t_1$ of the pellets, $t_2$ of the soldering material layers and $t_3$ of the spacer satisfying the equation:

$$(T_H - T_A)\,(\alpha_1 t_1 + \alpha_2 t_2 + \alpha_3 t_3) \leq (T_H - T_A)\,\alpha_4\,(t_1 + t_2 + t_3)$$

where $T_H$ is the apparent solidifying temperature of glass and $T_A$ is room temperature, so that a compressive stress is imparted to the rectifier unit in the axial direction thereof.

15. A high-voltage semiconductor device comprising:

a rectifier unit which includes first and second electrodes, a plurality of semiconductor pellets, each having a rectifying PN junction extending to the periphery thereof, and having a prescribed total thickness $t_1$ and a coefficient of thermal expansion $\alpha_1$, interposed between said first and second electrodes, a plurality of soldering material layers, having a prescribed total thickness $t_2$ and each being made of a material having a coefficient of thermal expansion $\alpha_2$ greater than the coefficient of thermal expansion $\alpha_1$ of said pellets, disposed between adjacent ones of said pellets, mechanically and electrically bonding and connecting said pellets with each other, said pellets and said soldering material layers being laminated together in the form of a stack, a first spacer, made of a material having low electrical resistance, a thickness $t_3$ and a coefficient of thermal expansion $\alpha_3$ which is approximate to that of said pellets, disposed between and contiguous to said first electrode and that soldering material layer which is at one end of said stack adjacent said first electrode, and a second spacer, made of a material having low electrical resistance, a thickness $t_4$, and said coefficient of thermal expansion $\alpha_3$, disposed between and contiguous to said second electrode and that soldering material layer which is at the other end of said stack adjacent said second electrode; and a protective glass layer for passivating the PN junction of said pellets and for protecting said rectifier unit against ambient mechanical stress, said glass layer having a prescribed coefficient of thermal expansion $\alpha_4$, surrounding and contiguous to the exposed surfaces of said pellets, said glass layer extending from the periphery of said first electrode to the periphery of said second electrode and being contiguous to the peripheries of said first and second electrodes, and wherein the total effective amount of thermal expansion of said rectifier unit is no greater than that of said glass, with the coefficients of thermal expansion $\alpha_1$, $\alpha_2$, $\alpha_3$ and $\alpha_4$, the thickness of $t_1$ of the pellet, $t_2$ of the soldering material layers, and $t_3$ and $t_4$ of the spacers satisfying the equation:

$$(T_H - T_A)\,(\alpha_1 t_1 + \alpha_2 t_2 + \alpha_3 (t_3 + t_4)) \leq (T_H - T_A)\alpha_4 (t_1 + t_2 + t_3 + t_4)$$

where $T_H$ is the apparent solidifying temperature of glass and $T_A$ is room temperature, so that a compressive stress is imparted to the rectifier unit in the axial direction thereof.

16. A high-voltage semiconductor device according to claim 14, wherein the material of which said soldering material layer are made consists of aluminum, and further including first and second lead wires respectively extending from and being mechanically and electrically bonded to said first and second electrodes in said axial direction and the sectional area of said axial direction and the sectional area of said spacer is substantially equal to that of said pellet, while the sectional area of each of said first and second electrodes is larger than that of the pellets.

17. A high-voltage semiconductor device according to claim 15, wherein the material of which said soldering material layers are made consists of aluminum, and further including first and second lead wires respectively extending from and being mechanically and electrically bonded to said first and second electrodes in said axial direction and the sectional area of said spacers is substantially equal to that of said pellet, while the sectional area of each of said first and second electrodes is larger than that of the pellets.

* * * * *